(12) United States Patent
Hiatt et al.

(10) Patent No.: US 7,498,240 B2
(45) Date of Patent: Mar. 3, 2009

(54) MICROFEATURE WORKPIECES, CARRIERS, AND ASSOCIATED METHODS

(75) Inventors: William M. Hiatt, Eagle, ID (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 468 days.

(21) Appl. No.: 11/218,039

(22) Filed: Aug. 31, 2005

(65) Prior Publication Data
US 2007/0048902 A1  Mar. 1, 2007

(51) Int. Cl.
*H01L 21/00* (2006.01)
(52) U.S. Cl. .............................. 438/464; 257/E21.599
(58) Field of Classification Search ................. 438/464
See application file for complete search history.

(56) References Cited
U.S. PATENT DOCUMENTS
5,950,072 A * 9/1999 Queyssac ..................... 438/118
2005/0170612 A1 * 8/2005 Miyanari et al. ............. 438/459

OTHER PUBLICATIONS

3M, "Wafer Support System for Ultra Thin Wafer Backgrinding", Apr. 2004.
Mould, D. J. et al., "A New Alternative for Temporary Wafer Mounting," GaAs ManTech, Conference Proceedings, pp. 109-112, Apr. 2002.

* cited by examiner

*Primary Examiner*—David A Zarneke
(74) *Attorney, Agent, or Firm*—Perkins Coie LLP

(57) ABSTRACT

Microfeature workpieces, carriers, and associated methods are disclosed. In a particular embodiment, one method for processing a microfeature workpiece can include temporarily attaching the microfeature workpiece to a carrier with a releasable connector, wherein the connector is at least partially metallic. The method can further include performing a manufacturing process on the microfeature workpiece while the microfeature workpiece is attached to the carrier. The method can still further include detaching the microfeature workpiece from the carrier by debonding the connector from at least one of the microfeature workpiece and the carrier. In at least some instances, the at least partially metallic connector can withstand increased processing temperatures, and can allow a wider variety of processes to be performed on the microfeature workpiece while it is attached to the carrier.

27 Claims, 5 Drawing Sheets

MICROFEATURE WORKPIECES, CARRIERS, AND ASSOCIATED METHODS

TECHNICAL FIELD

The present invention is directed generally toward microfeature workpieces, workpiece carriers, and associated methods, including methods for releasably attaching a microfeature workpiece to a carrier with a metallic connector.

BACKGROUND

Packaged microelectronic assemblies, such as memory chips and microprocessor chips, typically include a microelectronic die mounted to a substrate (e.g., an interposer board) and encased in a plastic protective covering. The die includes functional features, such as memory cells, processor circuits, and interconnecting circuitry. The die also typically includes die bond pads that are electrically coupled to the internal functional features. The bond pads are then coupled to corresponding first bond pads on the substrate (e.g., with wire bonds or solder balls), and this connection is protected with the plastic protective covering. The first substrate bond pads can be coupled to second substrate bond pads via pathways that are internal to the substrate. The second bond pads can in turn be connected to external electronic devices in which the die is installed.

In some cases, for example, when the microelectronic die includes an image sensor, the die bond pads are positioned on the opposite side of the die from the image sensor and other microelectronic elements. In such cases, the microelectronic die can include multiple through-wafer interconnects (TWIs) that extend through the die so as to electrically connect the microelectronic features located toward one surface of the die with bond pads positioned at the opposite surface of the die. In many cases, the formation of the TWIs and other manufacturing processes are conducted at the wafer level, i.e., prior to singulating individual dies from the wafer. At this point in the manufacturing process, the wafer is relatively thick. After the TWIs are formed, material can be removed from the backside of the wafer using a backgrinding process to thin the wafer prior to singulating the wafer into individual dies. Thinning the wafer reduces the thickness of the individual dies and therefore makes the dies easier to integrate with very compact electronic devices.

One drawback with the foregoing approach is that the wafer can be extremely difficult to handle after it has gone through the backgrinding process. In particular, the wafer can be so thin that it can easily break. One approach to addressing this drawback is to temporarily attach the wafer to a carrier which provides support for the wafer during manufacturing processes that are conducted after the wafer has been thinned and before individual dies are singulated from the wafer.

Existing techniques for supporting the thinned wafer during post-processing steps have also suffered from several drawbacks. For example, adhesives are typically used to temporarily attach the thinned wafer to the carrier during post-thinning operations. However, typical adhesives become soft and undergo a significant reduction in holding power at elevated temperatures (e.g., above about 150° C.). As a result of the temperature characteristics of the adhesive, high temperature processes cannot generally be completed on the wafer once it is attached to the carrier. In particular, the temperature limitations of the adhesive may limit the manufacturer to only certain processes that may be conducted on the wafer while it is attached to the carrier. For example, the manufacturer may be required to employ a low temperature process on the wafer, when a high temperature process would be more efficient and/or effective. Still further, typical carriers are made from a dielectric material, which can trap the heat that may be generated during processes conducted on the thinned wafer. As a result, the wafer may overheat, which can damage or destroy the functional elements of the wafer.

DETAILED DESCRIPTION

A. Introduction

The present invention is directed generally toward microfeature workpieces, carriers, and associated methods. In some aspects of the invention, microfeature workpieces can be temporarily attached to carriers with metallic connectors that allow a greater range of processes to be conducted on the microfeature workpiece after the attachment process. For example, a method for processing a microfeature workpiece in accordance with one aspect of the invention includes temporarily attaching the microfeature workpiece to a carrier with a releasable connector that is at least partially metallic. The method can further include performing a manufacturing process on the microfeature workpiece while the microfeature workpiece is attached to the carrier, and then detaching the microfeature workpiece from the carrier by debonding the connector from at least one of the microfeature workpiece and the carrier.

In further particular aspects, the connector can include a volume of solder. The connector can be attached between a bonding site of the microfeature workpiece that is not electrically coupled to any functional microelectronic elements of the microfeature workpiece. In still further particular aspects, multiple connectors can be used to attach the microfeature workpiece to the carrier. Processes that are conducted on the microfeature workpiece while it is attached to the carrier can include processes at elevated temperatures (e.g., at least 200° C., at least 220° C., or at least 250° C.). Other processes can include removing material from an outwardly facing surface of the microfeature workpiece and passivating that surface at an elevated temperature after material has been removed. In yet further aspects, heat can be discharged from the microfeature workpiece to the carrier via the connector, for example, during a process that includes elevating the temperature of the microfeature workpiece.

In other aspects of the invention, the connector can be generally homogenous and can be released by elevating a temperature of the connector to at least 180° C. to cause the connector to loosen. Detaching the microfeature workpiece can include leaving more residual connector material attached to the carrier than to the microfeature workpiece. The microfeature workpiece can be singulated into dies before or after the microfeature workpiece is removed from the carrier.

Aspects of the invention are also directed toward a microfeature workpiece. For example, a microfeature workpiece in accordance with one aspect of the invention includes a substrate material having a functional microelectronic element, and a conductive bond pad that is electrically coupled to the microelectronic element and connectible to an external structure. The substrate can further include a conductive bonding site that is not electrically coupled to any functional microelectronic element of the substrate material. In particular embodiments, the microelectronic element can include a memory device, a capacitor, or other elements. In still further particular embodiments, the conductive bonding site can include a residual portion of a metallic conductor, for example, a metallic conductor that was releasably connected between the microfeature workpiece and a carrier.

As used herein, the terms "microfeature workpiece" and "workpiece" refer to substrates on and/or in which microelectronic devices are integrally formed. Typical microelectronic devices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. The microfeature workpieces can be semiconductive pieces (e.g., doped silicon wafers or gallium arsenide wafers), non-conductive pieces (e.g., various ceramic substrates), or conductive pieces. In some cases, the workpieces are generally round, and in other cases, the workpieces have other shapes, including rectilinear shapes. Several embodiments of microfeature workpieces, carriers, and associated methods are described below. A person skilled in the relevant art will understand, however, that the invention may have additional embodiments, and that the invention may be practiced without several of the details of the embodiments described below with reference to FIGS. 1A-9.

Figure 1A:
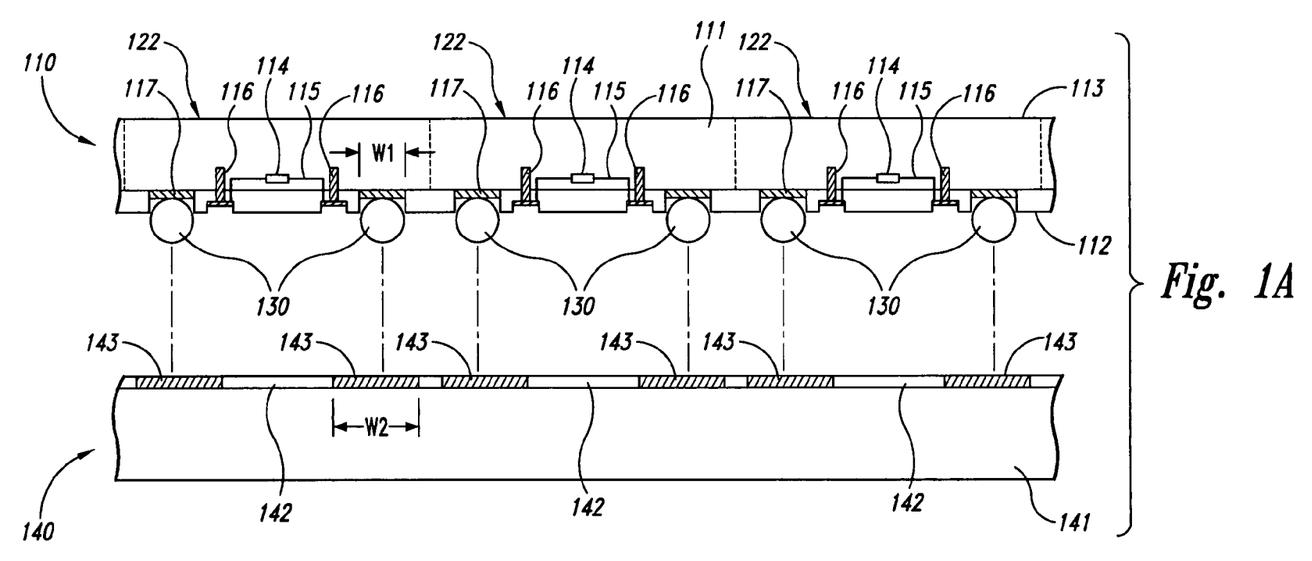
FIGS. 1A-1B illustrate a microfeature workpiece and carrier positioned to be temporarily attached to each other with connectors in accordance with an embodiment of the invention.

B. Microfeature Workpieces, Carriers, and Associated Method of Manufacture and Processing FIG. 1A is a partially schematic, cross-sectional side view of a microfeature workpiece 110 positioned to be coupled to a carrier 140 with releasable connectors 130 in accordance with an embodiment of the invention. The microfeature workpiece 110 can include a substrate material 111 having a first surface 112, a second surface 113 facing opposite from the first surface 112, and microelectronic elements 114 positioned between the first surface 112 and the second surface 113. The microelectronic elements 114 can include memory cells, capacitors, processor elements (e.g., image sensor processor elements), integrated circuits and/or other functional devices. The microelectronic elements 114 can be connected to interconnect structures 116 with internal connections 115. As will be described in greater detail below, material can be removed from the second surface 113 to expose the interconnect structure 116 and provide- for electrical connections between the microelectronic elements 114 and external devices.

In an embodiment shown in FIG. 1A, the microfeature workpiece 110 can include a wafer that in turn includes multiple microfeature dies 122. Each of the microfeature dies 122 can house one or more microelectronic elements 114 and the associated interconnect structures 116. After additional processing, the microfeature dies 122 can be singulated from the remaining portion of the microfeature workpiece 110 and then packaged or otherwise processed in preparation for and user applications.

Prior to singulation, the microfeature workpiece 110 can be releasably connected to the carrier 140 with the connectors 130. The connectors 130 can be attached between first bonding sites 117 at the first surface 112 of the microfeature workpiece 110, and corresponding second bond sites 143 of the carrier 140. In at least some embodiments, the first bonding sites 117 include an electrically conductive material (e.g., a metal), but are not electrically connected to any of the microelectronic elements 114. The first bonding sites 117 can be selected to include a material that is suitable for adhesion to the connectors 130. For example, when the connectors 130 include solder or another suitable material having an at least partially metallic composition, the first bonding sites 117 can include an at least partially metallic material to which the connectors 130 can readily adhere. In a particular example, the connectors 130 can include a tin/silver solder, and the first bonding sites 117 can include nickel.

The connectors 130 can be attached to the corresponding first bonding sites 117 via any of several existing processes. Such processes can include a solder wave process or a screen printing process. In any of these embodiments, the temperature of the first bonding sites 117 and the material forming the connectors 130 can be elevated by an amount sufficient to cause the connectors 130 to become at least partially flowable and to adhere to the corresponding first bonding sites 117.

After the connectors 130 have been attached to the first bonding sites 117, they are aligned with the corresponding second bonding sites 143 of the carrier 140. In a particular embodiment, the first bonding sites 117 can have a width W1 and the second bonding sites 143 can have a width W2 that is greater than the width W1. As will be described in greater detail below, this arrangement can cause the second bonding sites 143 to retain the bulk of the connectors 130 when the microfeature workpiece 110 and the carrier 140 are later separated from each other. In other embodiments, the first bonding sites 117 and the second bonding sites 143 can have different relative dimensions. For example, the first bonding sites 117 can be larger than the second bonding sites 143. In any of these embodiments, the carrier 140 can include a body 141 and a conductive layer 142 facing toward the microfeature workpiece 110. The second bonding sites 143 can be connected to and/or formed from the conductive layer 142, and can be configured to adhere to the connector 130 in a manner generally similar to that described above with reference to the first bonding sites 117. For example, the second bonding sites 143 can include nickel when the connectors 130 include a tin/silver solder.

Figure 1B:
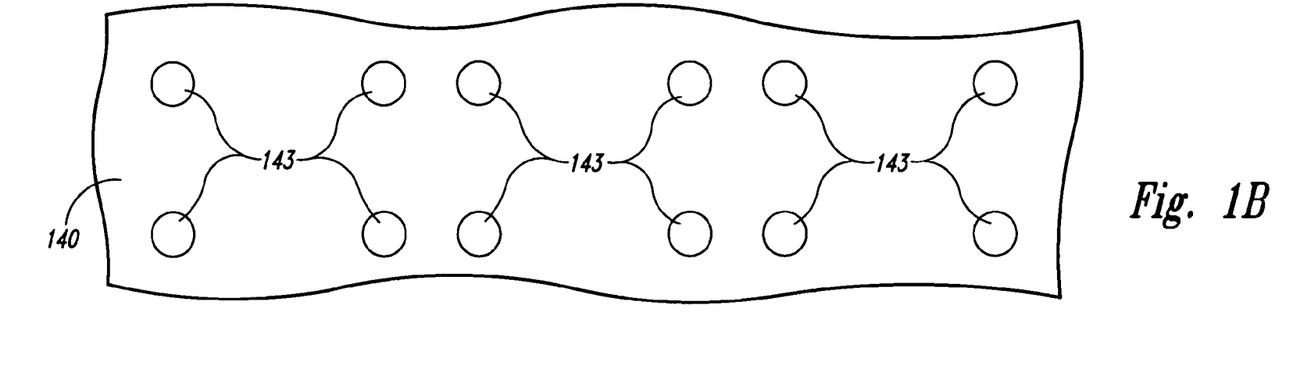

FIG. 1B is a top plan view of a portion of the carrier 140, illustrating an arrangement of the second bonding sites 143.

Referring to FIGS. 1A and 1B together, four second bonding sites 143 can be aligned with corresponding first bonding sites 117 of each microfeature die 122. In other embodiments, the number of second bonding sites 143 (and corresponding first bonding sites 117) for each microfeature die 122 can be different, depending on factors that can include the size of each microfeature die 122, the surface features of each microfeature die 122, and/or the sizes, shapes and/or locations of the first bonding sites 117 and the second bonding sites 143. The carrier 140 can be formed from any suitable substrate material (e.g., glass). In some embodiments, the carrier 140 can include a separate microfeature workpiece (e.g., a wafer). For example, the carrier 140 can include a wafer that has been discarded due to manufacturing defects.

Figure 2:
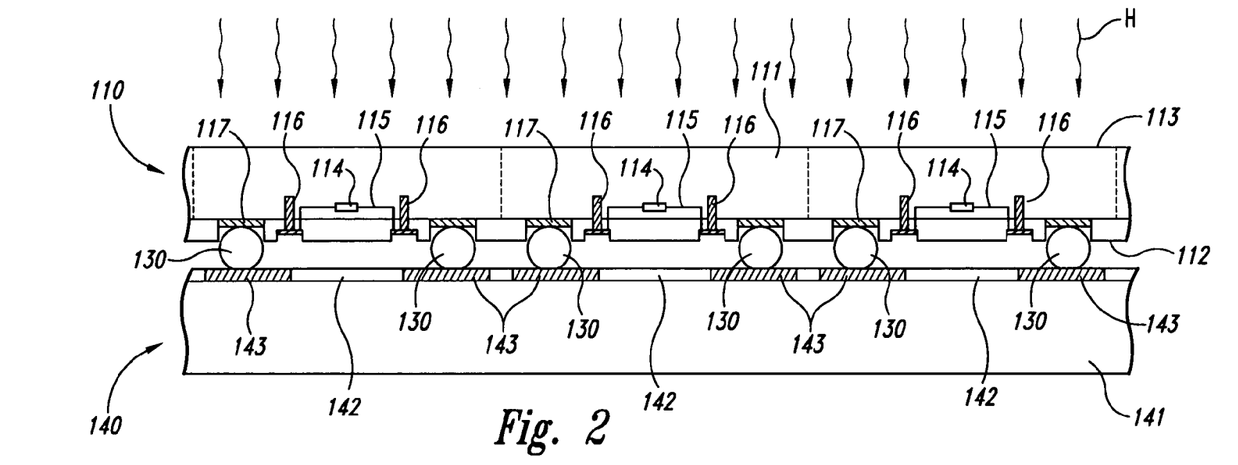
FIG. 2 is a partially schematic illustration of an assembly that includes a microfeature workpiece temporarily attached to a carrier in accordance with an embodiment of the invention.

FIG. 2 illustrates a process for temporarily attaching the microfeature workpiece 110 to the carrier 140 with the connectors 130. When the connectors 130 include solder or a solder-like material, the process can be at least generally similar to an existing solder reflow process. Accordingly, the microfeature workpiece 110 can be positioned in close proximity to the carrier 140, with the connectors 130 in contact with the second bonding sites 143 of the carrier 140. The combination of the microfeature workpiece 110 and the carrier 140 can be exposed to heat (represented by arrows H) to reflow or at least partially soften the connectors 130. The connectors 130 can accordingly wet to the second bonding sites 143. The microfeature workpiece 110 and the carrier 140 can then be cooled to form an assembly 150.

Figure 3:
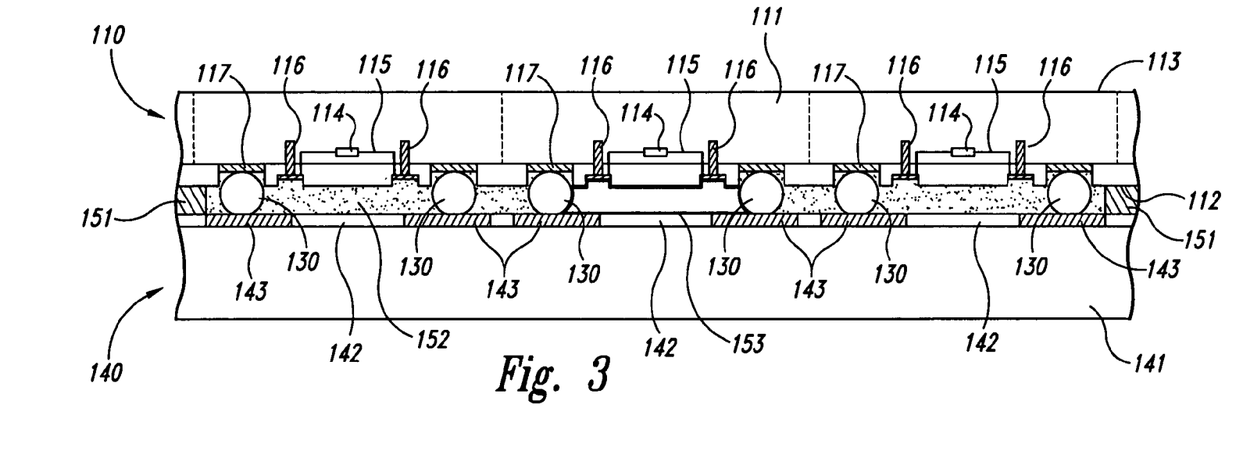
FIG. 3 is a partially schematic illustration of the microfeature workpiece and the carrier shown in FIG. 2, with representative protective materials applied between the microfeature workpiece and the carrier, in accordance with further embodiments of the invention.

In at least some embodiments, the processes conducted on the microfeature workpiece 110 while it is supported by the carrier 140 can create the potential for damage to structures at the first surface 112 of the microfeature workpiece 110. Accordingly, as is shown in FIG. 3, one or more techniques can be used to protect the first surface 112 and, optionally, the connectors 130 and the carrier 140. For purposes of illustration, several different techniques are shown together in FIG. 3. It will be understood that in an actual application, only one of these techniques or combinations of less than all the techniques shown may be used for a given assembly 150.

One technique for protecting the microfeature workpiece 110 can include providing a peripheral seal 151 between the microfeature workpiece 110 and the carrier 140. The peripheral seal 151 can include a temporary adhesive that forms a frame around the microfeature workpiece 110 and can accordingly prevent potentially harmful substances from gaining access to the first surface 112. In other embodiments, the region between the microfeature workpiece 110 and the carrier 140 can be filled with a fill material 152. The fill material 152 can include existing underfill substances, known to those of ordinary skill in the relevant art, such as are typically located between a microfeature die and an interposer board or other substrate with which the microfeature die is attached. In still another embodiment, a coating material 153 can be applied between the microfeature workpiece 110 and the carrier 140. The coating material 153 can include a chemically resistant polymer (e.g., parylene) that does not entirely fill the region between the microfeature workpiece 110 and the carrier 140 (as does the fill material 152), but instead coats the first surface 112 of the microfeature Workpiece 110, the connectors 130, and the exposed surfaces of the carrier 140. Any of the foregoing protective treatments can be removed after processing the microfeature workpiece 110 and prior to completing the individual microfeature dies 122.

Figure 4A:
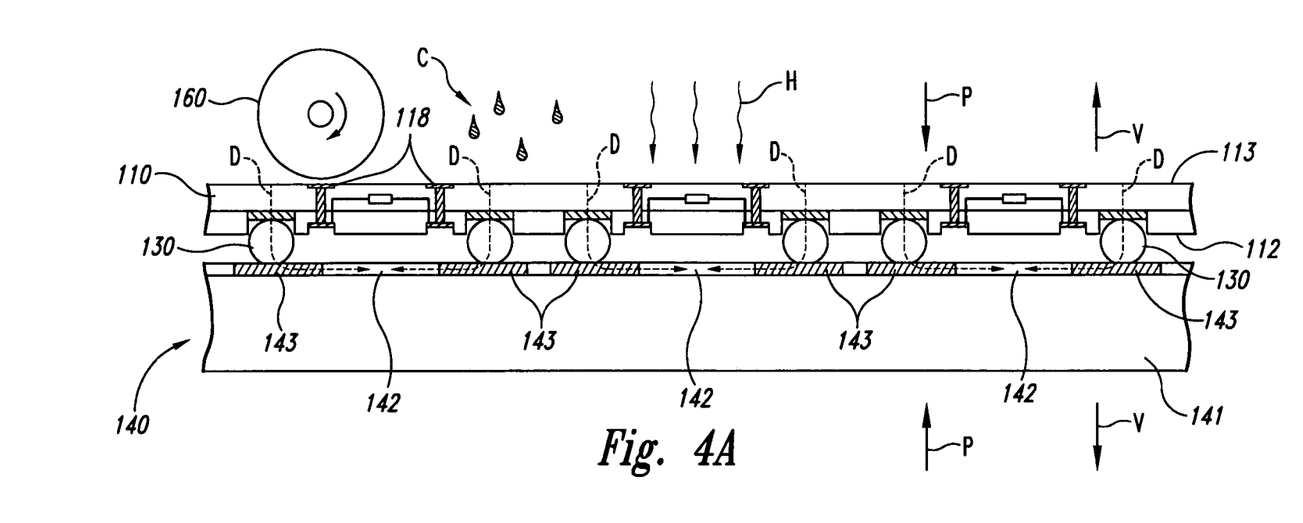
FIGS. 4A and 4B schematically illustrate processes that may be completed on the microfeature workpiece when it is temporarily attached to a carrier in accordance with an embodiment of the invention.
Figure 4B:
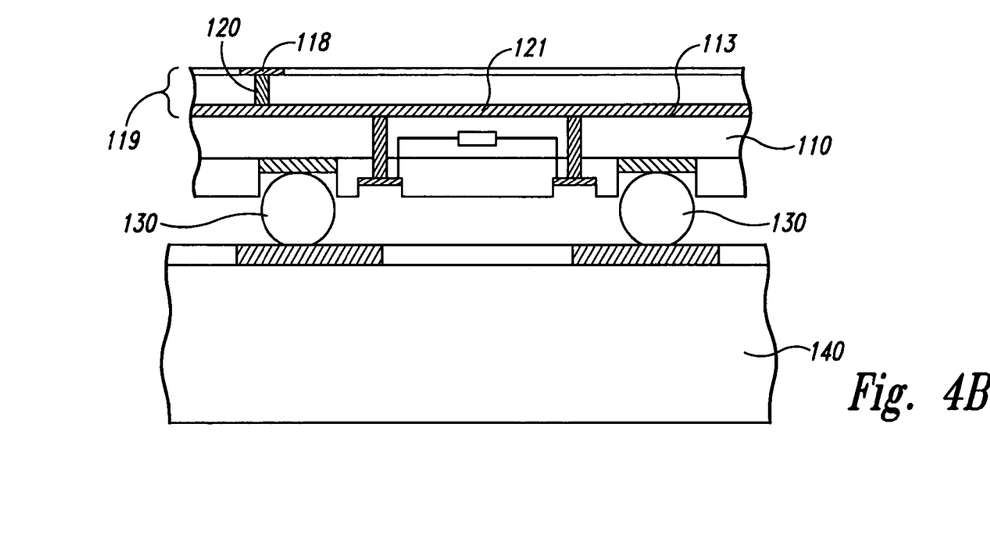

FIG. 4A is a partially schematic illustration of the microfeature workpiece 110 undergoing representative manufacturing processes while being attached to the carrier 140. For purposes of illustration, several of these processes are shown together in FIG. 4A. However, it will be understood that the microfeature workpiece 110 may be subjected to any one or a combination of these processes in any of a variety of sequential orderings. In at least some embodiments, the microfeature workpiece 110 can initially be relatively thick and accordingly, one of the processes performed on the microfeature workpiece 110 can include a backgrinding process in which a grinding wheel 160 removes material from the second surface 113 to reduce an overall thickness of the microfeature workpiece 110. In an embodiment in which the microfeature workpiece 110 includes interconnect structures 116 that extend from the first surface 112 toward the second surface 113, the backgrinding process can include removing enough material from the second surface 113 to expose the interconnect structure 116 and allow the formation of bond pads 118 at the second surface 113. The bond pads 118 can be formed using existing deposition and etching techniques known to those of ordinary skill in the art, and can provide for electrical communication between the internal microelectronic elements 114 and devices external to the microfeature workpiece 110. In other embodiments, the backgrinding process can be used simply to reduce the overall thickness of the microfeature workpiece 110, without necessarily exposing internal conductive elements for forming bond pads at the second surface 113. In such embodiments, the bond pads 118 may be formed at the first surface 112.

In other embodiments, processes in addition to or in lieu of the backgrinding process may be performed on the microfeature workpiece 110 while it is supported by the carrier 140. Such processes include a chemical process, (identified schematically in FIG. 4A by droplets C), in which the microfeature workpiece 110 is exposed to chemicals in vapor and/or liquid phase. The chemical process can include a chemical vapor deposition (CVD) process, a physical vapor deposition (PVD) process, a sputtering process, or other processes. In at least some embodiments, these processes may be performed while the microfeature workpiece 110 is under increased pressure (e.g., a pressure higher than atmospheric pressure), as indicated by arrows P, or reduced pressure (e.g., a vacuum or pressure less than atmospheric pressure), as indicated by arrows V.

The microfeature workpiece 110 may be exposed to heat (indicated by arrows H) to increase the temperature of the microfeature workpiece 110 during processing. The elevated temperature can include temperatures of at least 200° C. or 220° C. in particular embodiments. The upper limit of the temperature to which the microfeature workpiece 110 can be exposed may be limited by (a) the composition of the connectors 130, and (b) the thermal budget for the microfeature workpiece 110. Accordingly, the connectors 130 can be selected to have a melting (or softening) point that is high enough to withstand the elevated temperature to which the microfeature workpiece 110 is exposed. In addition, the carrier 140 can remove heat from the microfeature workpiece 110 to reduce the impact of the increased temperature on the thermal budget of the microfeature workpiece. For example, when the connectors 130 include a metallic material, they can conduct heat away from the microfeature workpiece 110 and into the conductive layer 142 of the carrier 140, as indicated by arrows D. The microfeature workpiece 110 may be exposed to elevated temperatures as a part of any of several processes. Such processes can include a CVD process for depositing an oxide film on the second surface 113 (e.g., a passivation process) after back grinding. Other such processes can include curing materials applied to the microfeature workpiece 110, for example, curing a spin-on dielectric.

In still further embodiments, other processes may be conducted on the microfeature workpiece 110 while it is attached to the carrier 140. For example, referring now to FIG. 4B, a redistribution layer 119 may be formed at the second surface 113 of the microfeature workpiece 110. The redistribution layer can include a laterally extending conductive traces 121, and a via 120 that is offset from the interconnect structure 116 and attached to a bond pad 118. The redistribution layer 119 can accordingly allow the bond pad 118 to be offset relative to the interconnect structure 116, and can be formed using existing deposition and etching techniques for depositing and selectively removing conductive material. In at least some cases, these techniques can include exposing the microfeature workpiece 110 to temperatures in the range described above (e.g., at least 200° C. or at least 220° C.). For example, forming the redistribution layer 119 can include applying polyimides or polymers that require curing at temperatures in excess of 200° C.

Figure 5:
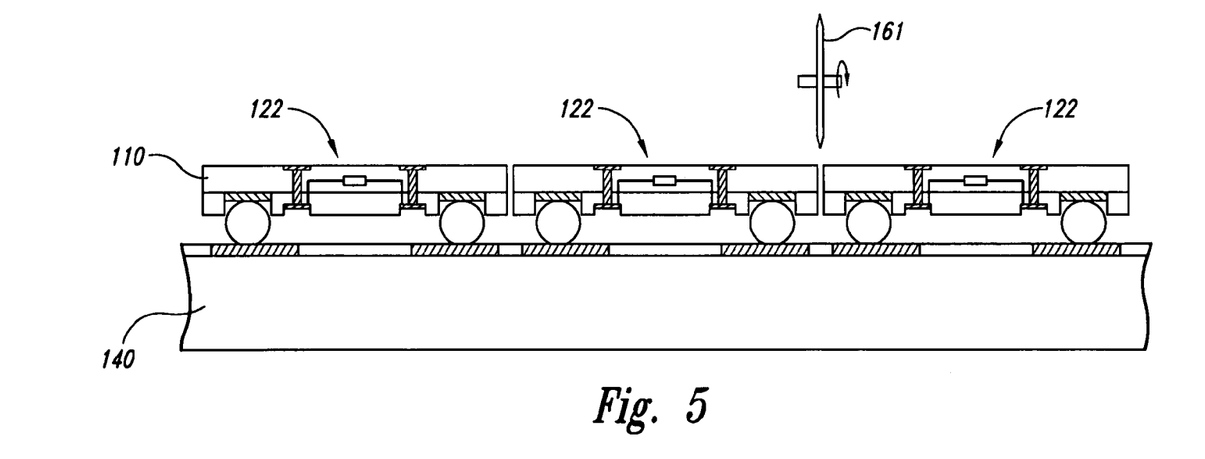
FIG. 5 is a schematic illustration of a process for singulating microfeature dies from a microfeature workpiece while the microfeature workpiece is attached to a carrier in accordance with an embodiment of the invention.

As shown in FIG. 5, the microfeature workpiece 110 can be diced to separate the individual microfeature dies 122, after selected processes (e.g., the processes described above with reference to FIGS. 4A-4B) have been completed. Accordingly, a dicing wheel 161 can be brought into contact with the microfeature workpiece 110 to separate adjacent microfeature dies 122 from each other. In another embodiment, a laser or other device can be used to perform the dicing process.

Figure 6:
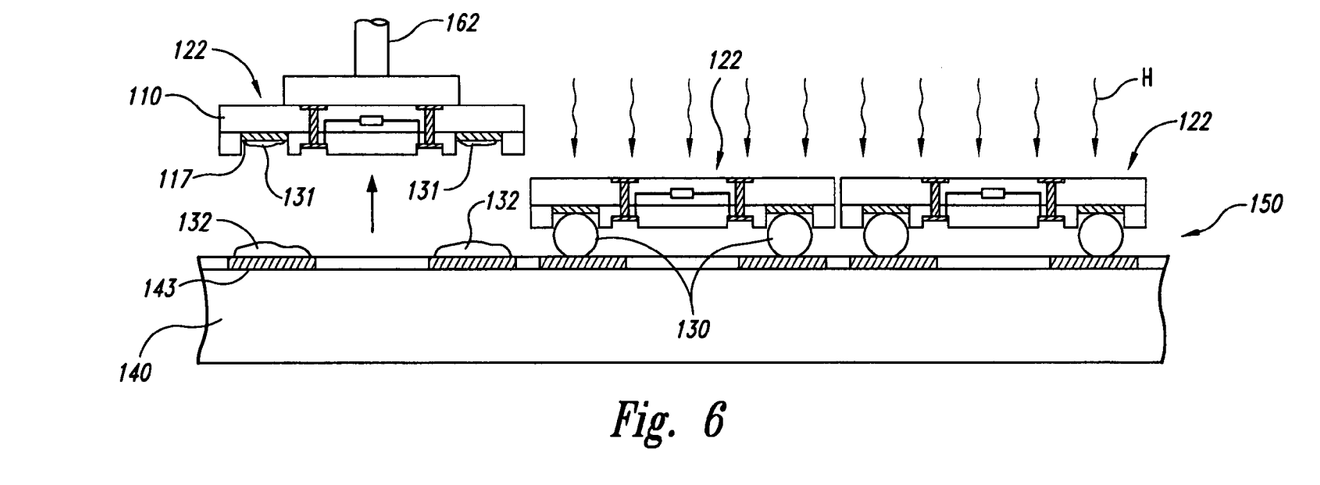
FIG. 6 schematically illustrates a process for removing singulated microfeature dies from a carrier in accordance with an embodiment of the invention.

FIG. 6 illustrates a method for removing the diced microfeature dies 122 from the carrier 140. In one aspect of this embodiment, heat H is applied to the assembly 150 to reflow or otherwise soften the connectors 130, allowing the microfeature dies 122 to be removed from the carrier 140. The temperature to which the microfeature workpiece 110 is elevated depends at least in part on the characteristics (in particular, the melting point) of the connectors 130. The melting point of the connectors 130 can in turn be selected based at least in part on the expected process temperature to which the microfeature workpiece 110 will be exposed while it is attached to the carrier 140. Accordingly, if the expected process temperature is 170° C., the connectors 130 can be selected to maintain adhesion up to at least 170° C. In particular embodiments, the connectors 130 can be selected to maintain adhesion at up to 170° C., 200° C., 220° C. or 250° C.

A pick-and-place mechanism 162 can be used to remove each microfeature die 122 from the carrier 140 using existing techniques. After the microfeature die 122 has been removed from the carrier 140, a first residual material 131 may remain at the first bonding site 117 of the microfeature die 122, and a second residual material 132 may remain at the second bonding site 143 of the carrier 140. In a particular aspect of this embodiment, the amount of the second residual material 132 can be greater than the amount of the first residual material 131, for example, when the second bonding site 143 is larger than the first bonding site 117. Accordingly, the amount of first residual material 131 may be small enough that it will not interfere with the processing and operation of the microfeature die 122 and therefore need not be removed. In another embodiment, only minimal post-processing may be necessary to remove the first residual material 131. The second residual material 132 can be removed from the carrier. 140 prior to a subsequent use, or the carrier 140 can be discarded after a single use.

Figure 7:
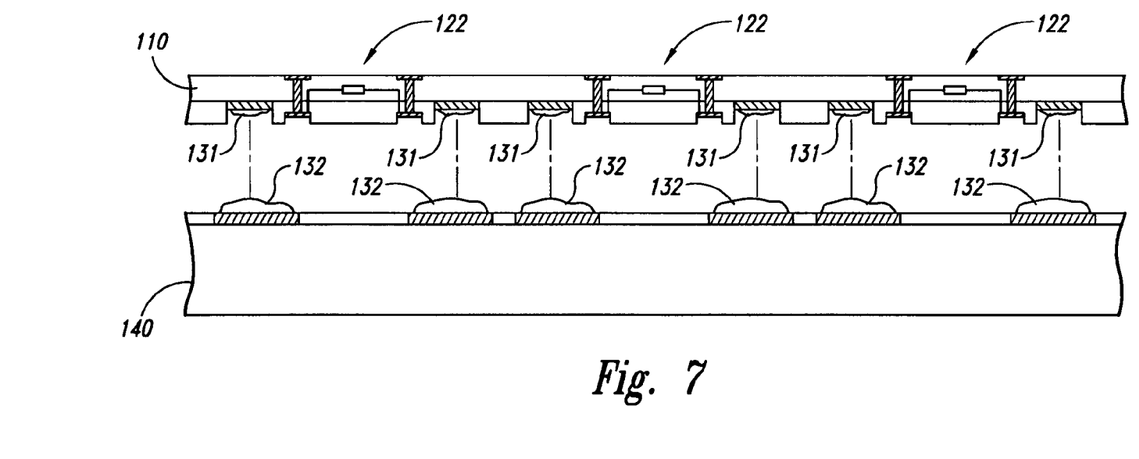
FIG. 7 schematically illustrates a process for releasing a microfeature workpiece as a unit from a carrier in accordance with an embodiment of the invention.

In another embodiment shown in FIG. 7, the microfeature workpiece 110 can be separated from the carrier 140 before the individual microfeature dies 122 are singulated from each other. The microfeature workpiece 110 can be subsequently attached to a dicing frame or other suitable structure for separating the microfeature dies 122 from each other after the microfeature workpiece 110 has been removed from the carrier 140. After the microfeature dies 122 have been singulated, they can be packaged or otherwise prepared for end user installation using conventional techniques.

Figure 8:
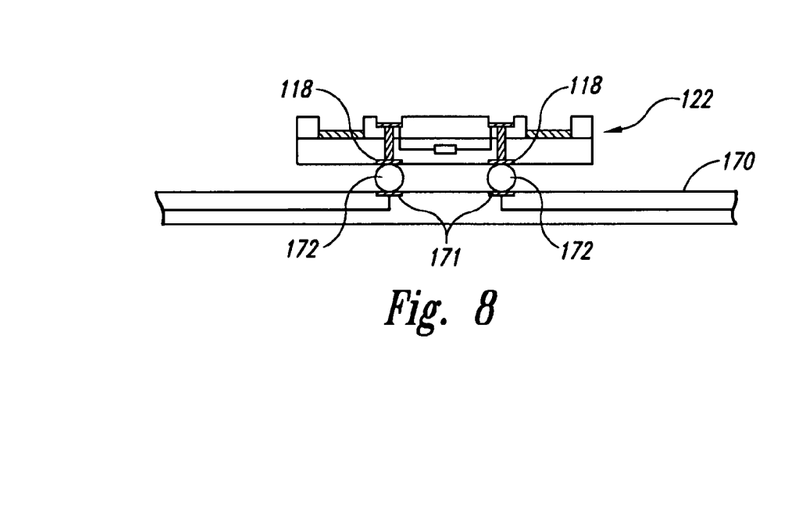
FIG. 8 schematically illustrates a singulated microfeature die attached to an external structure.

FIG. 8 is a partially schematic illustration of a singulated microfeature die 122 attached to an external structure 170. In this embodiment, the external structure 170 includes a support member (e.g., a printed circuitboard) having bond pads 171. The bond pads 171 can be electrically connected to the corresponding bond pads 118 of the microfeature die 122 using conductive couplers 172 (e.g., solder balls). The external structure 170 can support and/or be electrically connected to other devices that can communicate with the microfeature die via the bond pads 171.

Figure 9:
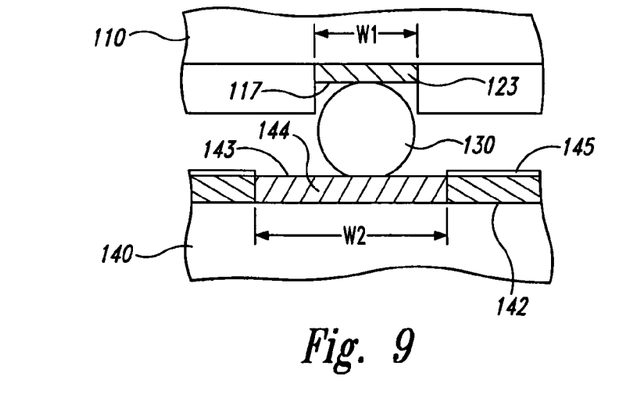
FIG. 9 is a partially schematic illustration of a microfeature workpiece and carrier having bond sites configured in accordance with an embodiment of the invention.

FIG. 9 is an enlarged, partially schematic cross-sectional illustration of the microfeature workpiece 110 and the carrier 140, illustrating further details of the first bond site 117 and the second bond site 143. The first bond site 117 can include a first bond site material 123 that is suitable for adhering to the connector 130. For example, the first bond site material 123 can include nickel when the connector 130 includes a solder material. The second bond site 143 can include a second bond site material 144 that also includes a suitable material, such as nickel. In one aspect of this embodiment, the adjacent conductive layer 142 can include aluminum which is patterned (e.g., removed) at the second bond site 143 to allow for the application of the second bond site material 144. In other embodiments, the second bond site material 144 can be applied to the conductive layer 142. In either embodiment, the conductive layer 142 can remain in physical and thermal contact with the second bond site material 144 to allow for heat transfer away from the microfeature workpiece 110 to the conductive layer 142 via the connector 130.

In another embodiment, the conductive layer 142 can include copper. In such cases, the copper can be covered with a dielectric layer 145 to prevent the copper from dissolving upon with solder, which (as described above) may form a constituent of the connector 130. Such contact may occur when the connector 130 is attached to the second bond site in a reflow process (e.g., after first being applied to the microfeature workpiece 110) or in a solder wave process (e.g., if the connector 130 is attached to the carrier 140 prior to being attached to the microfeature workpiece). In both cases, the dielectric layer 145 can prevent solder in the connector 130 from attacking the copper conductive layer 142.

One feature of several embodiments of the methods and systems described above is that they can include a releasable connector that is at least partially metallic, and that is temporarily attached between the microfeature workpiece and the carrier. An advantage of the at least partially metallic connector is that it can have a high melting point, e.g., higher than the melting or softening point of most conventional adhesives. As a result, the microfeature workpiece can undergo high temperature processes without destroying the bond between the microfeature workpiece and the carrier. This arrangement can allow the manufacturer greater flexibility in the types of processes that may be conducted on the microfeature workpiece while it is attached to the carrier, and can accordingly improve the throughput associated with production of such devices.

Another advantage of at least some of the foregoing embodiments is that allowing processes to be conducted at higher temperatures on the microfeature workpiece after the microfeature workpiece has been attached to the carrier can increase the speed with which such processes can be conducted. For example, in at least some existing processes, material is applied to the microfeature workpiece after it has been attached to the carrier using low temperature CVD or PVD techniques. These techniques can take a significant period of time to build up material to the thicknesses required for the resulting structures. By performing these processes (or alternate processes) at higher temperatures, the same material thickness can be provided in a significantly shorter period of time. This can still further increase the throughput associated with forming such devices and can accordingly reduce the cost of such devices.

In some embodiments, the connectors can have other characteristics while still achieving at least some of the foregoing advantages. For example, the connectors can have a generally homogeneous structure that may or may not be metallic, and can be released at temperatures in excess of 170° C. In particular embodiments, such connectors can be released at a temperature of 100° C., 220° C. or 250° C. An advantage of the generally homogenous structure is that it allows the connector to be applied in a single-step operation directly to one of the carrier and the microfeature workpiece, and then bonded directly to the other. This is unlike some existing processes which require a separately applied releasable layer at the interface between a bulk connector (e.g., an adhesive) and the bonding site.

From the foregoing, it will be appreciated that specific embodiments of the invention have been described herein for purposes of illustration, but that various modifications may be made without deviating from the invention. For example, in some embodiments, the connectors can be applied to the carrier first, before being attached to the microfeature workpiece, rather than the other way around. Aspects of the invention described in the context of particular embodiments may be combined or eliminated in other embodiments. Further, while advantages associated with certain embodiments of the invention have been described in the context of those embodiments, other embodiments may also exhibit such advantages. Not all embodiments need necessarily exhibit such advantages to fall within the scope of the invention. Accordingly, the invention is not limited, except as by the appended claims.

We claim:

1. A method for processing a microfeature workpiece, comprising:
   temporarily attaching a microfeature workpiece to a carrier with multiple releasable connectors, the connectors being at least partially metallic and spaced apart from each other, wherein temporarily attaching the microfeature workpiece includes attaching the connectors to bonding sites of the microfeature workpiece and to bonding sites of the carrier, and wherein the bonding sites of the microfeature workpiece are not electrically connected to any functional microelectronic elements of microfeature workpiece;
   performing a manufacturing process on the microfeature workpiece while the microfeature workpiece is attached to the carrier; and
   detaching the microfeature workpiece from the carrier by debonding the connector from at least one of the microfeature workpiece and the carrier.

2. The method of claim 1 wherein attaching the microfeature workpiece includes attaching the microfeature workpiece with a volume of solder.

3. The method of claim 1 wherein attaching the microfeature workpiece includes attaching the connector to a bonding site of the microfeature workpiece and to a bonding site of the carrier, and wherein the bonding site of the microfeature workpiece is larger than the bonding site of the carrier.

4. The method of claim 1 wherein attaching the microfeature workpiece includes attaching the connector to a bonding site of the microfeature workpiece and to a bonding site of the carrier, and wherein the bonding site of the microfeature workpiece is smaller than the bonding site of the carrier.

5. The method of claim 1 wherein attaching the microfeature workpiece to the carrier includes heating the releasable connector.

6. The method of claim 1 wherein attaching the microfeature workpiece to the carrier includes heating the releasable connector to attach the connector to one of the microfeature workpiece and the carrier and then heating the connector again to attach the connector to the other of the microfeature workpiece and the carrier.

7. The method of claim 1, further comprising disposing a removable protective material in a region between the microfeature workpiece and the carrier.

8. The method of claim 1 wherein attaching the microfeature workpiece includes applying the connector to the workpiece and attaching the connector directly to the carrier without separately applying connector material to the carrier prior to attaching the connector to the carrier.

9. The method of claim 1 wherein elevating a temperature includes causing the connector to flow.

10. The method of claim 1 wherein detaching the microfeature workpiece includes elevating a temperature of the connector to at least 170° C.

11. The method of claim 1 wherein detaching the microfeature workpiece includes elevating a temperature of the connector to at least 200° C.

12. The method of claim 1 wherein detaching the microfeature workpiece includes elevating a temperature of the connector to at least 220° C.

13. The method of claim 1 wherein detaching the microfeature workpiece includes elevating a temperature of the connector to at least 250° C.

14. The method of claim 1 wherein detaching the microfeature workpiece includes leaving more residual connector material attached to the carrier than to the microfeature workpiece.

15. The method of claim 1 wherein the microfeature workpiece has a first surface and a second surface facing opposite from the first surface, and wherein attaching the microfeature workpiece includes attaching the first surface of the microfeature workpiece, and wherein performing a process on the microfeature workpiece includes removing material from the second surface of the microfeature workpiece.

16. The method of claim 1 wherein the microfeature workpiece has a first surface and a second surface facing opposite from the first surface, and wherein attaching the microfeature workpiece includes attaching the first surface of the microfeature workpiece, and wherein performing a process on the microfeature workpiece includes:
   removing material from the second surface of the microfeature workpiece; and
   passivating the second surface after removing material from the second surface, wherein passivating includes elevating a temperature of the workpiece.

17. The method of claim 1 wherein the microfeature workpiece has a first surface and a second surface facing opposite from the first surface, and wherein attaching the microfeature workpiece includes attaching the first surface of the microfeature workpiece, and wherein performing a process on the microfeature workpiece includes forming a conductive interconnect structure extending from the first surface to the second surface.

18. The method of claim 1 wherein performing a process includes elevating a temperature of the microfeature workpiece to at least 200° C.

19. The method of claim 1 wherein performing a process includes elevating a temperature of the microfeature workpiece to at least 220° C.

20. The method of claim 1 wherein performing a process includes elevating a temperature of the microfeature workpiece and discharging heat from the microfeature workpiece to the carrier via the connector.

21. The method of claim 1 wherein the carrier includes a metallic material, and wherein:
   attaching the microfeature workpiece includes attaching the connector to the metallic material of the carrier; and wherein
   performing a process includes elevating a temperature of the microfeature workpiece and discharging heat from the microfeature workpiece to the metallic material of the carrier via the connector.

22. The method of claim 1 wherein performing a process includes conducting a chemical vapor deposition process.

23. The method of claim 1 wherein performing a process includes conducting a sputtering process.

24. The method of claim 1 wherein performing a process includes subjecting the microfeature workpiece to a pressure significantly different than atmospheric pressure.

25. The method of claim 1 wherein performing a process includes forming metal redistribution layer on the microfeature workpiece.

26. The method of claim 1, further comprising singulating microelectronic dies from the microfeature workpiece while the microfeature workpiece is connected to the carrier.

27. The method of claim 1, further comprising singulating microelectronic dies from the microfeature workpiece after detaching the microfeature workpiece from the carrier.

* * * * *